(12) United States Patent  
Kim et al.

(10) Patent No.: US 11,551,776 B2  
(45) Date of Patent: Jan. 10, 2023

(54) MEMORY DEVICE AND MEMORY SYSTEM INCLUDING THE SAME

(71) Applicant: SAMSUNG ELECTRONICS CO., LTD., Suwon-si (KR)

(72) Inventors: Sung-Rae Kim, Seoul (KR); Myung Kyu Lee, Seoul (KR); Ki Jun Lee, Seoul (KR); Jun Jin Kong, Yongin-si (KR); Yeong Geol Song, Seoul (KR); Jin-Hoon Jang, Uiwang-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/392,382

(22) Filed: Aug. 3, 2021

(65) Prior Publication Data

US 2022/0180958 A1 Jun. 9, 2022

(30) Foreign Application Priority Data

Dec. 9, 2020 (KR) ........................ 10-2020-0171363

(51) Int. Cl.
| | |
|---|---|
| *G11C 29/42* | (2006.01) |
| *G11C 29/44* | (2006.01) |
| *G11C 29/00* | (2006.01) |
| *G11C 29/18* | (2006.01) |
| *G11C 29/14* | (2006.01) |

(52) U.S. Cl.  
CPC .............. *G11C 29/42* (2013.01); *G11C 29/14* (2013.01); *G11C 29/18* (2013.01); *G11C 29/4401* (2013.01); *G11C 29/783* (2013.01)

(58) Field of Classification Search  
CPC ......... G11C 29/42; G11C 29/14; G11C 29/18; G11C 29/4401; G11C 29/783  
See application file for complete search history.

(56) References Cited

U.S. PATENT DOCUMENTS

| | | | |
|---|---|---|---|
| 9,891,976 | B2 | 2/2018 | Chen et al. |
| 10,019,312 | B2 | 7/2018 | Healy et al. |
| 10,153,028 | B2 | 12/2018 | Kim |
| 10,423,482 | B2 | 9/2019 | Loewenstein |
| 10,460,826 | B2 | 10/2019 | Jo |
| 10,705,908 | B2 | 7/2020 | Chung et al. |
| 2014/0013183 | A1* | 1/2014 | Sohn ................... G06F 11/10 714/763 |
| 2016/0055056 | A1* | 2/2016 | Son ..................... G06F 11/1068 714/764 |

(Continued)

*Primary Examiner* — Tuan T Nguyen  
(74) *Attorney, Agent, or Firm* — Lee IP Law, P.C.

(57) ABSTRACT

A memory device includes a memory cell array including memory cells arranged in a plurality of rows; an ECC engine configured to detect an error in first data that is read from the memory cell array in response to a read command and a read address, to output a first error occurrence signal, and to correct the error in the first data; a row fail detector configured to output a fail row address, which indicates a fail row among the plurality of rows; and a flag generator configured to receive the read address, the first error occurrence signal, and the fail row address, and to generate a decoding state flag, which indicates whether an error is detected and whether an error is corrected, and a fail row flag, which indicates that a read row address included in the read address is the fail row address.

20 Claims, 13 Drawing Sheets

(56) References Cited

U.S. PATENT DOCUMENTS

| | | |
|---|---|---|
| 2016/0077940 A1* | 3/2016 | Son .................. G11C 29/70 |
| | | 714/6.22 |
| 2019/0042360 A1 | 2/2019 | Song |
| 2019/0073261 A1 | 3/2019 | Halbert et al. |
| 2019/0156909 A1* | 5/2019 | Lee .................. G11C 29/76 |
| 2019/0340067 A1 | 11/2019 | Kim et al. |
| 2020/0133768 A1 | 4/2020 | Lee et al. |
| 2020/0159617 A1 | 5/2020 | Cha et al. |

* cited by examiner

MEMORY DEVICE AND MEMORY SYSTEM INCLUDING THE SAME

CROSS-REFERENCE TO RELATED APPLICATION

Korean Patent Application No. 10-2020-0171363, filed on Dec. 9, 2020 in the Korean Intellectual Property Office, and entitled: "Memory Device and Memory System Including the Same," is incorporated by reference herein in its entirety.

BACKGROUND

1. Field

The present disclosure relates to a memory device and a memory system including the same.

2. Description of the Related Art

Semiconductor memory devices may be classified into a non-volatile memory device such as a flash memory device and a volatile memory device such as a DRAM. The volatile memory device, such as a DRAM, is relatively inexpensive and is therefore used to store a large capacity of data, such as a system memory. Further, in the volatile semiconductor memory device such as a DRAM, a process scale is reduced to increase the degree of integration.

SUMMARY

Embodiments are directed to a memory device, including: a memory cell array including memory cells arranged in a plurality of rows; an ECC engine configured to detect an error in first data that is read from the memory cell array in response to a read command and a read address, to output a first error occurrence signal, and to correct the error in the first data; a row fail detector configured to output a fail row address, which indicates a fail row among the plurality of rows; and a flag generator configured to receive the read address, the first error occurrence signal, and the fail row address, and to generate a decoding state flag, which indicates whether an error is detected and whether an error is corrected, and a fail row flag, which indicates that a read row address included in the read address is the fail row address.

Embodiments are also directed to a memory device, including: a memory cell array including memory cells arranged in a plurality of rows; an ECC engine configured to detect an error in first data that is read from the memory cell array in response to a read command and a read address, to output an error occurrence signal and a syndrome of the error in the first data, and to correct the error in the first data; a row fail detector configured to periodically detect a fail row address, which indicates a fail row among the plurality of rows; and a flag generator configured to compare a read row address included in the read address with the fail row address, generate a fail row flag, which indicates that the read row address is a fail row address, when the read row address and the fail row address are the same, and generate a decoding state flag, which indicates whether an error is detected and whether an error is corrected, based on the syndrome and the error occurrence signal, when the read row address and the fail row address are not the same.

Embodiments are also directed to a memory system, including: a memory device; and a memory controller configured to provide a read command and a read address to the memory device. The memory device may include: a memory cell array including memory cells arranged in a plurality of rows, an ECC engine configured to detect an error in first data that is read from the memory cell array in response to the read command and the read address, to output a first error occurrence signal, and to correct the error in the first data, a row fail detector configured to output a fail row address, which indicates a fail row among the plurality of rows, and a flag generator configured to generate a decoding state flag and a fail row flag based on the read address, the first error occurrence signal, and the fail row address. The fail row flag may be made up of two bits and may have a first value, and the decoding state flag may be made up of two bits and may have any one of second, third, and fourth values that are each different from the first value and different from each other.

BRIEF DESCRIPTION OF THE DRAWINGS

Features will become apparent to those of skill in the art by describing in detail example embodiments with reference to the attached drawings in which.

DETAILED DESCRIPTION

Figure 1:
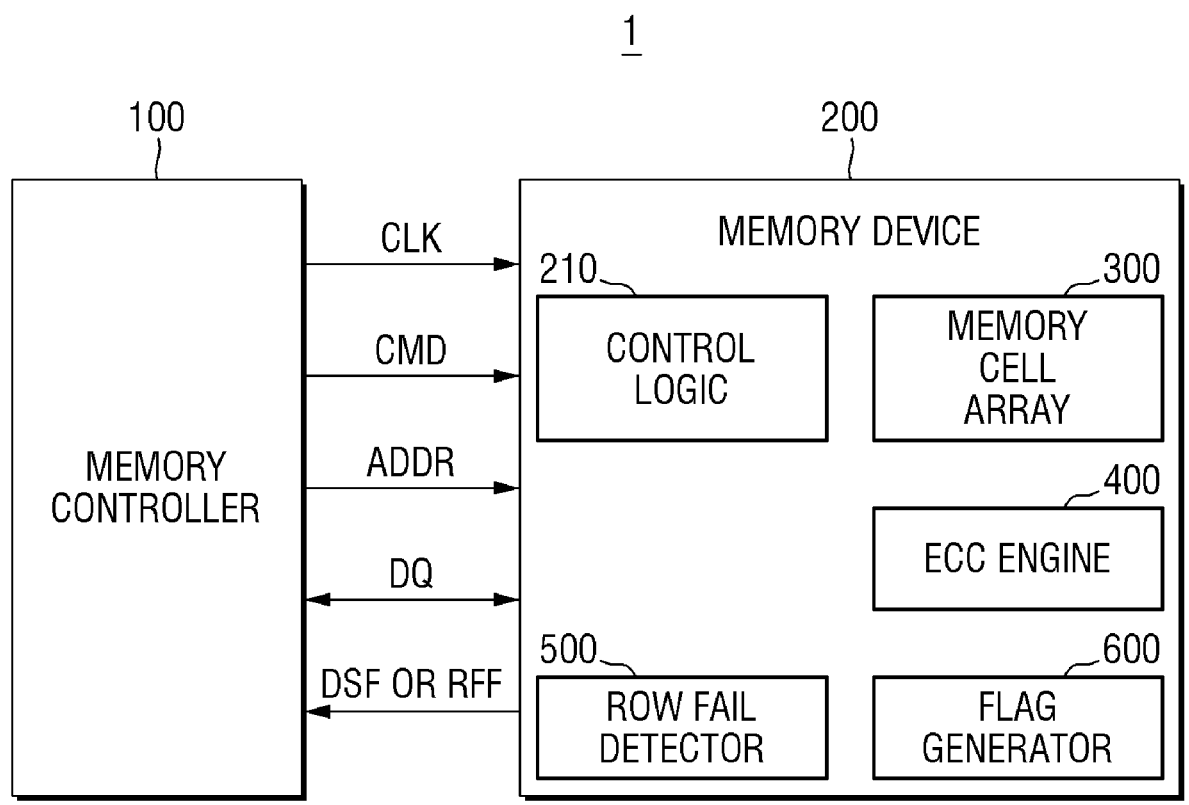
FIG. 1 is a block diagram for explaining a memory system according to some example embodiments.

FIG. 1 is a block diagram for explaining a memory system according to some example embodiments.

Referring to FIG. 1, a memory system 1 according to some example embodiments may include a memory controller 100 and a memory device 200.

The memory controller 100 may generally control the operation of the memory system 1. The memory controller 100 may apply an operation command for controlling the memory device 200 to control the operation of the memory device 200.

The memory controller 100 may control a data exchange between a host and the memory device 200. The memory controller 100 may write data in the memory device 200 or read data from the memory device 200 in response to a request from the host.

For example, the memory controller 100 may transmit a clock signal CLK, a command CMD and an address ADDR to the memory device 200, and send and receive data DQ to and from the memory device 200. The memory device 200 may transmit a decoding state flag DSF or a fail row flag RFF to the memory controller 100.

The decoding state flag DSF may include information about whether to detect an error occurring in the memory cell array 300 of the memory device 200 and whether to correct the detected error. The fail row flag RFF may include information about the fact that the row of the memory cell array 300 indicated by the read row address (included in the read address input together with a read command) is a fail row.

The memory device 200 may include a control logic 210, a memory cell array 300, an ECC (Error Correction Code) engine 400, a row fail detector 500, and a flag generator 600.

In some example embodiments, the memory device 200 may be a DRAM (dynamic random access), a DDR4 (double data rate 4) SDRAM (synchronous DRAM), an LPDDR4 (low power DDR4) SDRAM or a LPDDR5 SDRAM, a DDR5 SDRAM, or a GDDR (graphic DDR) including dynamic memory cells. According to some example embodiments, the memory device 200 may be a static memory (SRAM) device that includes static memory cells (or bit cells).

The control logic 210 may generally control the operation of the memory device 200.

The ECC engine 400 may detect an error of the read data, which are read from the memory cell array 300, under the control of the control logic 210, and may generate an error occurrence signal, correct the error, and output read data in which an error is corrected. The ECC engine 400 may generate a parity bit for the write data to be written in the memory cell array 300 under the control of the control logic 210, and the parity bits thus generated may be written in the memory cell array 300 together with the write data.

The row fail detector 500 may periodically detect the fail row address based on the error occurrence signal that is output from the ECC engine 400.

The flag generator 600 may generate a decoding state flag DSF or a fail row flag RFF based on the fail row address that is output from the row fail detector 500 and the error occurrence signal that is output from the ECC engine 400. The decoding state flag DSF may indicate whether an error has been detected from the read data read from the memory cell array 300 and whether to correct the detected error. The fail row flag RFF may indicate that the read row address included in the read address is a fail row address.

The decoding state flag DSF and the fail row flag RFF may be made up of two or more bits and may have different values from each other. For example, the decoding state flag DSF and the fail row flag RFF may be made up of two bits, and may have different values from each other. The fail row flag may have a first value, and the decoding state flag DSF may have one of second to fourth values different from the first value. For example, the fail row flag RFF may have a value of '10', and the decoding state flag DSF may have any one of values '00', '01' and '11'. The decoding state flag DSF may have a value of '00' when no error is detected, may have a value of '01' when an error is detected and the detected error is corrected, and may have a value of '11' when the error is detected and the error is not corrected. The decoding state flag DSF and the fail row flag RFF may have fixed values, and the memory controller 100 may set a mode register set for setting the mode of the memory device 200 to change the type of error bits that indicate the decoding state flag DSF and the fail row flag RFF.

Figure 2:
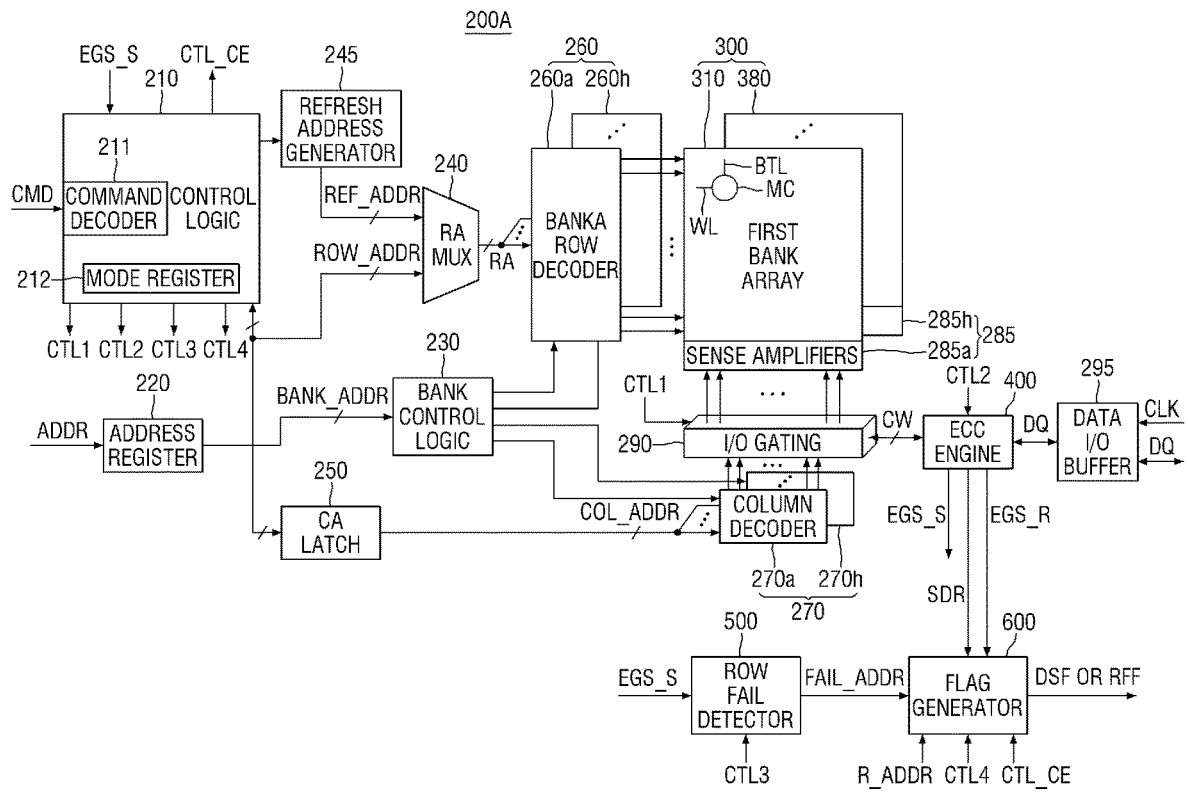
FIG. 2 is a block diagram for explaining a memory device of FIG. 1.

FIG. 2 is a block diagram for explaining the memory device of FIG. 1.

Referring to FIGS. 1 and 2, a memory device 200A may include the control logic 210, an address register 220, a bank control logic 230, a row address multiplexer 240, a refresh address generator 245, a column address latch 250, a row decoder 260, a column decoder 270, a sense amplifier 285, an I/O gating circuit 290, the memory cell array 300, the ECC engine 400, the row fail detector 500, the flag generator 600, and a data I/O buffer 295.

The memory cell array 300 may include a plurality of memory cells MC for storing data. For example, the memory cell array 300 may include first to eighth bank arrays 310 to 380. Each of the first to eighth bank arrays 310 to 380 may include a plurality of word lines WL, a plurality of bit lines BTL, and a plurality of memory cells MC formed at points where the word lines WL and the bit line BTL intersect.

The plurality of memory cells MC may include the first to eighth bank arrays 310 to 380. Although FIG. 2 shows the memory device 200A including eight bank arrays 310 to 380, embodiments are not limited thereto, and the memory device 200A may include any number of bank arrays.

The control logic 210 may control the operation of the memory device 200A. For example, the control logic 210 may generate the control signals such that the memory device 200A performs an operation of writing the data or an operation of reading the data. The control logic 210 may include a command decoder 211 that decodes the command CMD received from the memory controller 100, and a mode register 212 for setting the operating mode of the memory device 200A.

For example, the command decoder 211 may decode a write enable signal /WE, a row address strobe signal /RAS, a column address strobe signal /CAS, a chip selection signal /CS, and the like to generate the control signals corresponding to the command CMD. The control logic 210 may also receive a clock signal CLK and a clock enable signal /CKE for driving the memory device 200A in a synchronous manner.

The control logic 210 may control the refresh address generator 245 to generate a refresh row address REF_ADDR in response to a refresh command.

The address register 220 may receive the address ADDR from the memory controller 100. For example, the address register 220 may receive the address ADDR including a bank address BANK_ADDR, a row address ROW_ADDR, and a column address COL_ADDR. The address register 220 may provide the received bank address BANK_ADDR to the bank control logic 230, provide the received row address ROW_ADDR to the row address multiplexer 240, and provide the received column address COL_ADDR to the column address latch 250.

The bank control logic 230 may generate a bank control signal in response to the bank address BANK_ADDR received from the address register 220. In response to the bank control signals, a bank row decoder corresponding to the bank address BANK_ADDR among the first to eighth bank row decoders 260a to 260h may be activated, and a bank column decoder corresponding to the bank address BANK_ADDR among first to eighth bank column decoders 270a to 270h may be activated.

The row address multiplexer 240 may receive the row address ROW_ADDR from the address register 220, and receive the refresh row address REF_ADDR from the refresh address generator 245. The row address multiplexer 240 may selectively output the row address ROW_ADDR received from the address register 220 or the refresh row address REF_ADDR received from the refresh address generator 245, as a row address RA. The row address RA that is output from the row address multiplexer 240 may be applied to each of the first to eighth bank row decoders 260a to 260h.

The refresh address generator 245 may generate a refresh row address REF_ADDR for refreshing the memory cells. The refresh address generator 245 may provide the refresh row address REF_ADDR to the row address multiplexer 240. As a result, the memory cells placed on the word line corresponding to the refresh row address REF_ADDR may be refreshed.

The column address latch 250 may receive the column address COL_ADDR from the address register 220 and temporarily store the received column address COL_ADDR. The column address latch 250 may gradually increase the received column address COL_ADDR in a burst mode. The column address latch 250 may apply the temporarily stored or gradually increased column addresses COL_ADDR to each of the first to eighth bank column decoders 270a to 270h.

The row decoder 260 may include the first to eighth bank row decoders 260a to 260h connected to each of the first to eighth bank arrays 310 to 380. The column decoder 270 may include first to eighth bank column decoders 270a to 270h connected to each of the first to eighth bank arrays 310 to 380. The sense amplifier 285 may include first to eighth bank sense amplifiers 285a to 285h connected to each of the first to eighth bank arrays 310 to 380.

The bank row decoder activated by the bank control logic 230 among the first to eighth bank row decoders 260a to 260h may decode the row address RA output from the row address multiplexer 240 to activate a word line corresponding to the row address RA. For example, the activated bank row decoder may apply a word line drive voltage to the word line corresponding to the row address RA.

The bank column decoder activated by the bank control logic 230 among the first to eighth bank column decoders 270a to 270h may activate the bank sense amplifiers 285a to 285h corresponding to the bank address BANK_ADDR and the column address COL_ADDR through the I/O gating circuit 290.

The I/O gating circuit 290 may include an input data mask logic, read data latches for storing the data output from the first to eighth bank arrays 310 to 380, and write drivers for writing data in the first to eighth bank arrays 310 to 380, together with gating circuits for gating the I/O data.

A code word CW to be read from one of the first to eighth bank arrays 310 to 380 may be detected by the bank sense amplifiers 285a to 285h corresponding to the one bank array, and may be stored in the read data latches. The ECC engine 400 may perform ECC decoding on the code word CW stored in the read data latches. When an error is detected from the data of the code word CW, the ECC engine 400 may output a first error occurrence signal EGS_R, while correcting the error, and may provide the corrected data DQ to the memory controller 100 through the data I/O buffer 295. The first error occurrence signal EGS_R and a syndrome SDR generated in the process of detecting an error from data of the code word CW by the ECC engine 400 may be provided to the flag generator 600.

Data DQ to be written in one of the first to eighth bank arrays 310 to 380 may be provided to the ECC engine 400, the ECC engine 400 may generate the parity bits based on the data DQ, and provide the data DQ and the parity bits to the I/O gating circuit 290. The I/O gating circuit 290 may write the data DQ and the parity bits on a subpage of the one bank array through the write drivers.

The data I/O buffer 295 may provide the data DQ to the ECC engine 400 based on the clock signal CLK provided from the memory controller 100 in the write operation, and may provide the data DQ provided from the ECC engine 400 to the memory controller 100 in the read operation.

The ECC engine 400 may perform ECC decoding on the code word that is read from each row in which the refresh operation is performed, in a section in which the refresh operation is performed on a plurality of rows included in the memory cell array 300. The ECC engine 400 may perform the ECC decoding by reading a code word from each of the subpages that make up a single row. When an error is detected from the code word data that is read from each row, the ECC engine 400 may output a second error occurrence signal EGS_S, and may perform a scrubbing operation of correcting the error and writing the error-corrected data on the corresponding subpage again. Thus, the ECC engine 400 may output the second error occurrence signal EGS_S and perform the scrubbing operation in an error check and scrubbing section among the sections in which the refresh operation is performed on the plurality of rows included in the memory cell array 300.

The row fail detector 500 may receive and count the second error occurrence signal EGS_S from the ECC engine 400. For example, the row fail detector 500 may count the second error occurrence signal EGS_S for each row included in the memory cell array 300, and detect the fail row based on this. The row fail detector 500 may provide the fail row address FAIL_ADDR corresponding to the fail row to the flag generator 600.

The row fail detector 500 may detect fail rows in the error check and scrubbing section among the sections in which the refresh operation on a plurality of rows included in the memory cell array 300 is performed. Accordingly, the row fail detector 500 may periodically detect the fail row address FAIL_ADDR corresponding to the fail row.

The flag generator 600 may receive a read row address R_ADDR from the address register 220, receive the syndrome SDR and the first error occurrence signal EGS_R from the ECC engine 400, and receive the fail row address FAIL_ADDR from the row fail detector 500. The flag generator 600 may generate the decoding state flag DSF or the fail row flag RFF based on the read row address R_ADDR, the fail row address FAIL_ADDR, the syndrome SDR, and the first error occurrence signal EGS_R, and may provide the decoding state flag DSF or the fail row flag RFF to the memory controller 100.

The control logic 210 may generate a first control signal CTL1 for decoding the command CMD to control the I/O gating circuit 290, a second control signal CTL2 for generating the ECC engine 400, a third control signal CTL3 for controlling the row fail detector 500, and a fourth control signal CTL4 and a comparsion signal CTL_CE for controlling the flag generator 600. The control logic 210 may generate the fifth control signal CTL5 based on the second error occurrence signal EGS_S provided from the ECC engine 400.

Figure 3:
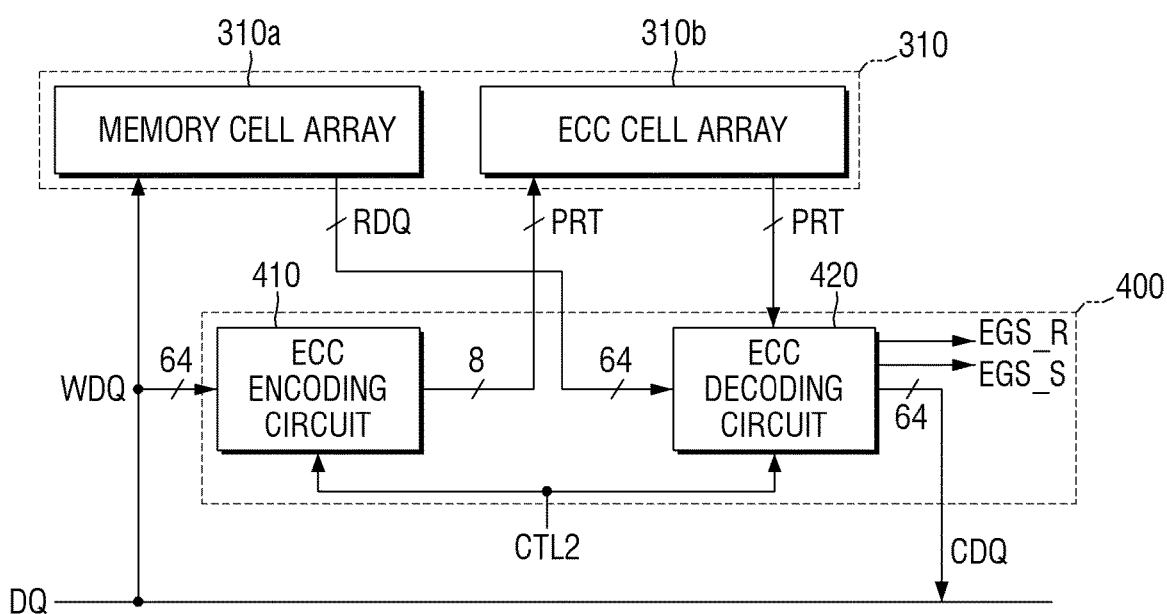
FIG. 3 is a block diagram for explaining an ECC engine of FIG. 2.

FIG. 3 is a block diagram for explaining the ECC engine of FIG. 2. For convenience of explanation, the first bank array 310 is shown along with the ECC engine 400.

Referring to FIG. 3, the first bank array 310 may include a normal cell array NCA (memory cell array 310a) and a redundancy cell array RCA (ECC cell array 310b).

The ECC engine 400 may include an ECC encoding circuit 410 and an ECC decoding circuit 420.

The ECC encoding circuit 410 may generate parity bits PRT related to the write data WDQ to be written in the memory cells of the normal cell array NCA (310a) in response to the second control signal CTL2. The parity bits PRT may be stored in the redundancy cell array RCA (310b). According to the present example embodiment, the ECC encoding circuit 410 may generate parity bits PRT on the write data WDQ to be written in the memory cells including the fail cell of the normal cell array NCA (310a) in response to the second control signal CTL2.

The ECC decoding circuit 420 may correct an error, using data RDQ that is read (i.e., read data) from the memory cells of the normal cell array NCA (310a) and the parity bits PRT read from the redundancy cell array RCA (310b) in response to the second control signal CTL2, and may output error-corrected data CDQ. According to the present example embodiment, the ECC decoding circuit 420 may correct an error, using the read data RDQ that is read from the memory cells including the fail cell of the normal cell array NCA (310a) and the parity bits read from the redundancy cell array RCA (310b) in response to the second control signal CTL2, and may output the error-corrected data CDQ. The ECC decoding circuit 420 may output the error occurrence signals EGS_R, EGS_S, while correcting the error. The ECC decoding circuit 420 may output the first error occurrence signal EGS_R at the time of the read operation of the memory device 200, and may output the second error occurrence signal EGS_S at the time of the scrubbing operation of the memory device 200.

Figure 4:
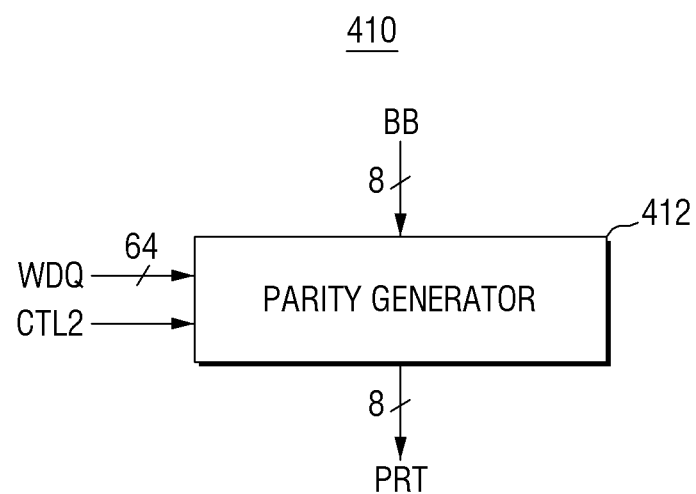
FIG. 4 is a block diagram for explaining an ECC encoding circuit of FIG. 3.

FIG. 4 is a block diagram for explaining the ECC encoding circuit of FIG. 3.

Referring to FIG. 4, the ECC encoding circuit 410 may include a parity generator 412 that receives write data WDQ and basis bit BB in response to the second control signal CTL2, and generates the parity bits PRT, using an XOR array calculation. The basis bit BB may be bits for generating the parity bits PRT of the write data WDQ. The basis bit BB may be made up of, for example, b'00000000 bits. The basis bit BB may utilize other specific bits instead of the b'00000000 bits.

Figure 5:
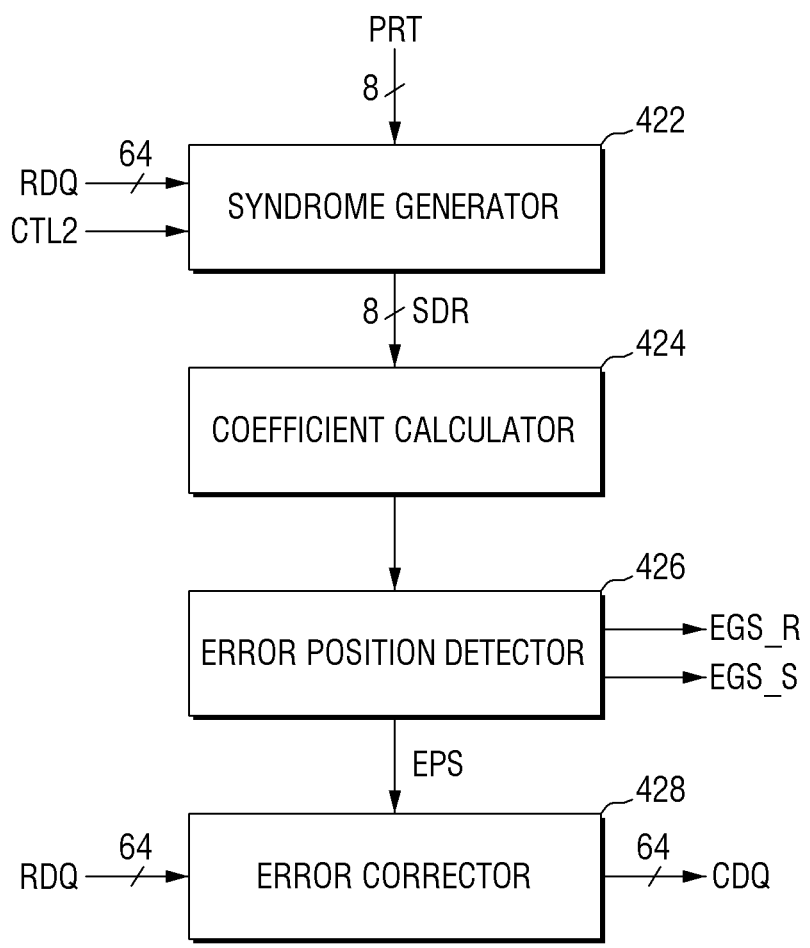
FIG. 5 is a block diagram for explaining the ECC decoding circuit of FIG. 3.

FIG. 5 is a block diagram for explaining the ECC decoding circuit of FIG. 3.

Referring to FIG. 5, the ECC decoding circuit 420 may include a syndrome generator 422, a coefficient calculator 424, an error position detector 426, and an error corrector 428.

The syndrome generator 422 may receive the read data RDQ and the parity bit PRT in response to the second control signal CTL2, and generate the syndrome SDR, using the XOR array calculation.

The coefficient calculator 424 may calculate a coefficient of an error position equation, using the syndrome SDR. The error position equation may be an equation in which a reciprocal of the error bit is a radix.

The error position detector 426 may calculate the position of a 1-bit error, using the calculated error position equation. The error position detector 426 may provide the error corrector 428 with an error position signal EPS indicating the position of a 1-bit error. When an error is detected from the read data RDQ, the error position detector 426 may output an error occurrence signal EGS, e.g., EGS_R and/or EGS_S.

The error corrector 428 may receive the read data RDQ and determine the position of the 1-bit error included in the read data RDQ based on the error position signal EPS. The error corrector 428 may correct the error by inverting the logic value of the bit in which the error has occurred among the read data RDQ according to the determined 1-bit error position information, and may output the error-corrected read data CDQ.

Figure 6:
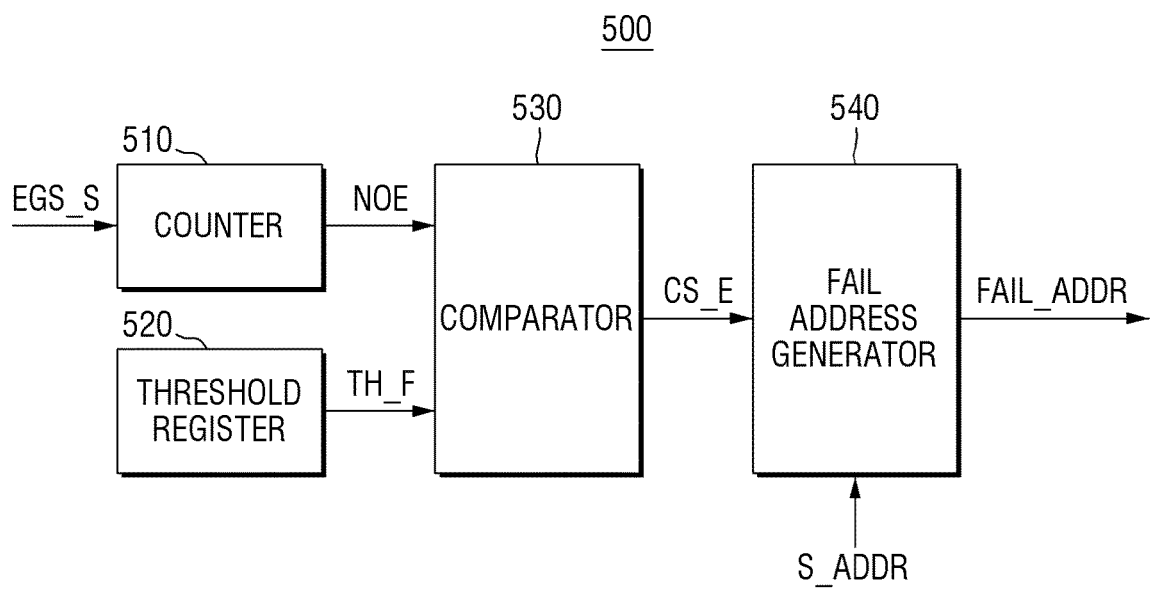
FIG. 6 is a block diagram for explaining a row fail detector of FIG. 2.

FIG. 6 is a block diagram for explaining the row fail detector of FIG. 2.

Referring to FIGS. 2 and 6, the row fail detector 500 may include a counter 510, a threshold register 520, a comparator 530, and a fail row address generator 540.

The counter 510 may receive the second error occurrence signal EGS_S generated in the code word that is read from each row in which the refresh operation is performed from the ECC engine 400. The counter 510 may receive the second error occurrence signal EGS_S and count the second error occurrence signal EGS_S. The counter 510 may provide a signal NOE indicating the number of error occurrences to the comparator 530 based on the counted second error occurrence signal EGS_S.

The threshold register 520 may store a threshold TH_F. The threshold TH_F may be, for example, a value that is set in response to a command CMD provided from the memory controller (100 of FIG. 1).

The comparator 530 may compare the signal NOE indicating the number of error occurrences with the threshold TH_F read from the threshold register 520, and output a comparison signal CS_E indicating a comparison result.

The fail row address generator 540 may receive the comparison signal CS_E and the read row, and may generate a fail row address FAIL_ADDR based on the comparison signal CS_E. For example, the fail row address generator 540 may determine a row as a fail row when the number of error occurrences occurring in the code word read from the row is equal to or greater than the threshold TH_F, and may output a row address S ADDR indicated by the row as the fail row address FAIL_ADDR.

As a result, the row fail detector 500 may detect whether each row on which the refresh is performed is a fail row.

Figure 7:
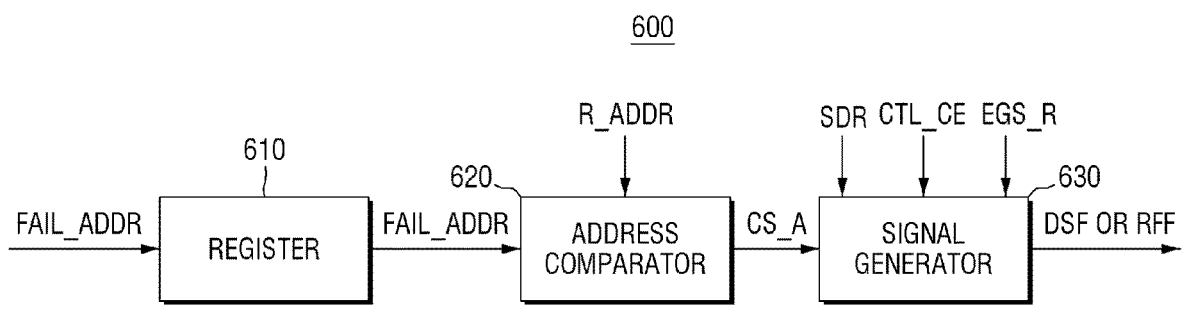
FIG. 7 is a block diagram for explaining a flag generator of FIG. 2.

FIG. 7 is a block diagram for explaining the flag generator of FIG. 2.

Referring to FIGS. 2 and 7, the flag generator 600 may include a register 610, an address comparator 620, and a signal generator 630.

The fail row address FAIL_ADDR provided from the row fail detector 500 may be stored in the register 610.

The address comparator 620 may receive the read row address R_ADDR included in the read address ADDR at the time of the read operation of the memory cell array 300. The address comparator 620 may compare the read row address R_ADDR with the fail row address FAIL_ADDR read from the register 610, and output a comparison signal CS_A indicating a comparison result.

The signal generator 630 may receive the comparison signal CS_A and output the decoding state flag DSF or the fail row flag RFF based on the comparison signal CS_A. The signal generator 630 may generate the fail row flag RFF when the read row address R_ADDR is the same as the fail row address FAIL_ADDR read from the register 610. The signal generator 630 may generate the decoding state flag DSF when the read row address R_ADDR is not the same as the fail row address FAIL_ADDR read from the register 610. The signal generator 630 may generate a decoding state flag DSF based on the comparison signal CTL_CE provided from the control logic 210 and the first error occurrence signal EGS_R provided from the ECC engine 400.

Figure 8:
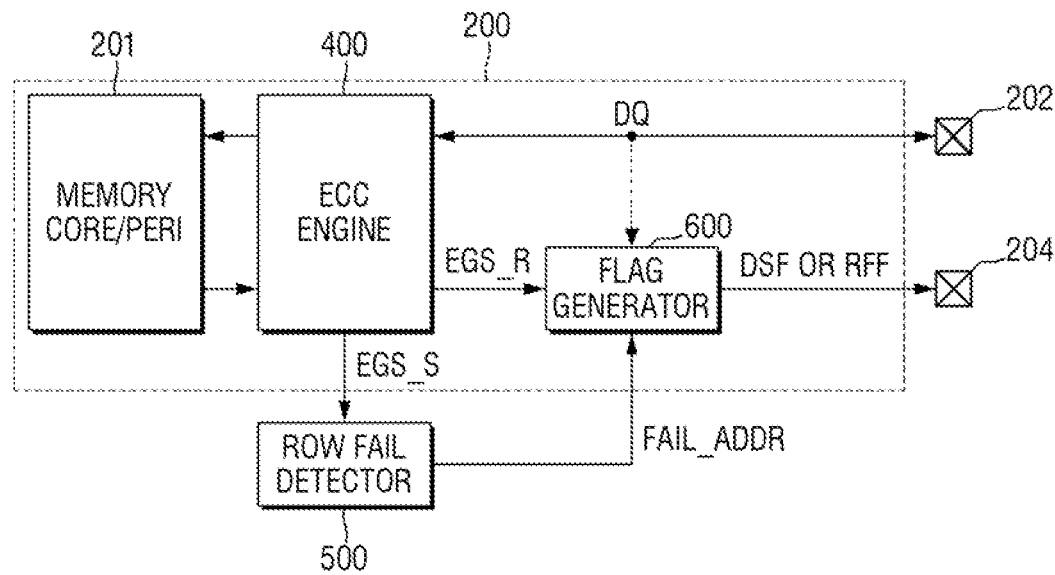
FIG. 8 is a diagram for explaining the operation of the memory device of FIG. 2.

FIG. 8 is a diagram for explaining the operation of the memory device of FIG. 2.

In FIG. 8, a memory core/peri 201 is assumed to include the components, except for the ECC engine 400, the row fail detector 500, and the flag generator 600, in the memory device 200A of FIG. 2.

Referring to FIGS. 2 and 8, the flag generator 600 may generate a decoding state flag DSF or a fail row flag RFF, based on the fail row address FAIL_ADDR provided from the row fail detector 500 and the first error occurrence signal EGS_R provided from the ECC engine 400. The row fail detector 500 may detect a fail row based on the second error occurrence signal EGS_S provided from the ECC engine 400 and output the fail row address FAIL_ADDR.

The memory device 200 may include a first pin 202 and a second pin 204 different from each other.

The memory device 200 may send and receive data DQ to and from the memory controller 100 through the first pin 202. The data DQ in which an error is corrected by the ECC engine 400 may be provided to the memory controller 100 through the first pin 202. The first pin 202 may be, for example, a data pin.

The memory device 200 may provide the memory controller 100 with the decoding state flag DSF or the fail row flag RFF through the second pin 204. The second pin 204 may be, for example, a DMI pin. The second pin 204 may be made up the first sub-pin and a second sub-pin different from each other, and the decoding state flag DSF or the fail row flag RFF may be made up of two bits accordingly.

Figure 9:
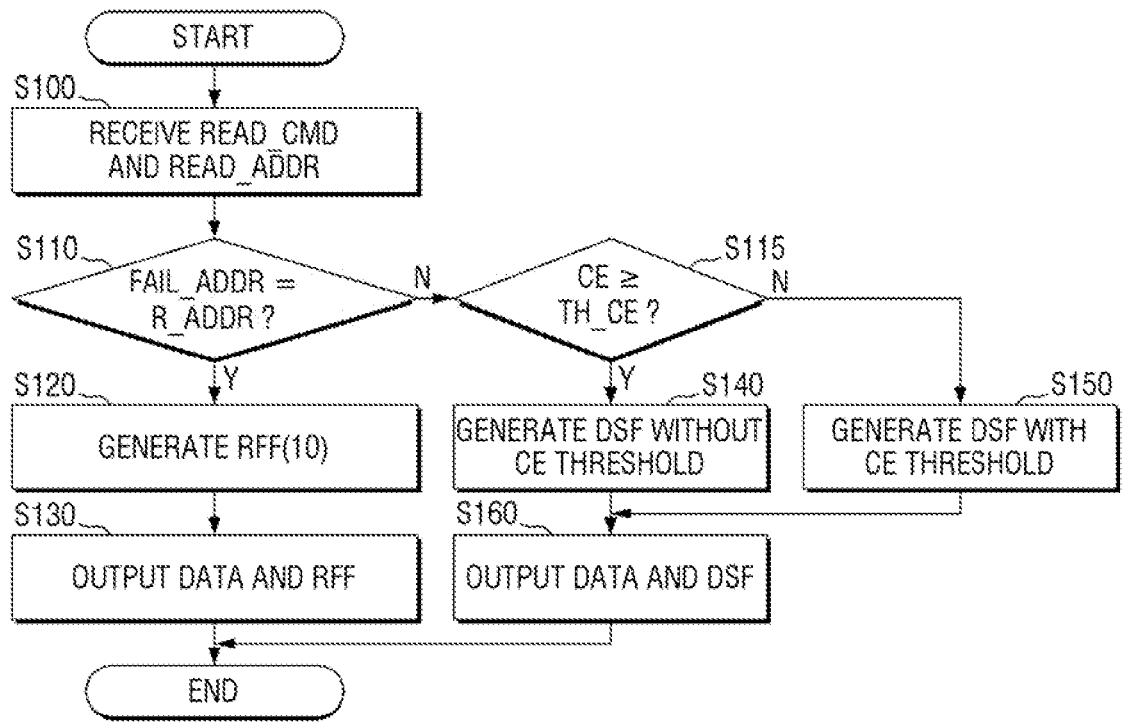
FIG. 9 is a flowchart for explaining the operation of the memory device according to some example embodiments.
Figure 10:
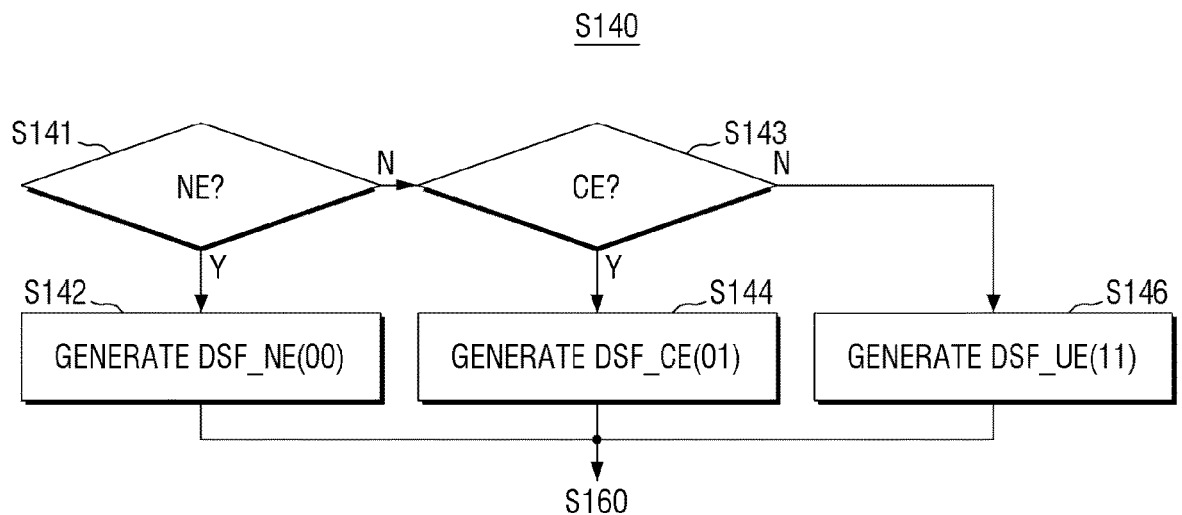
FIG. 10 is a flowchart for explaining operation S140 of FIG. 9.
Figure 11:
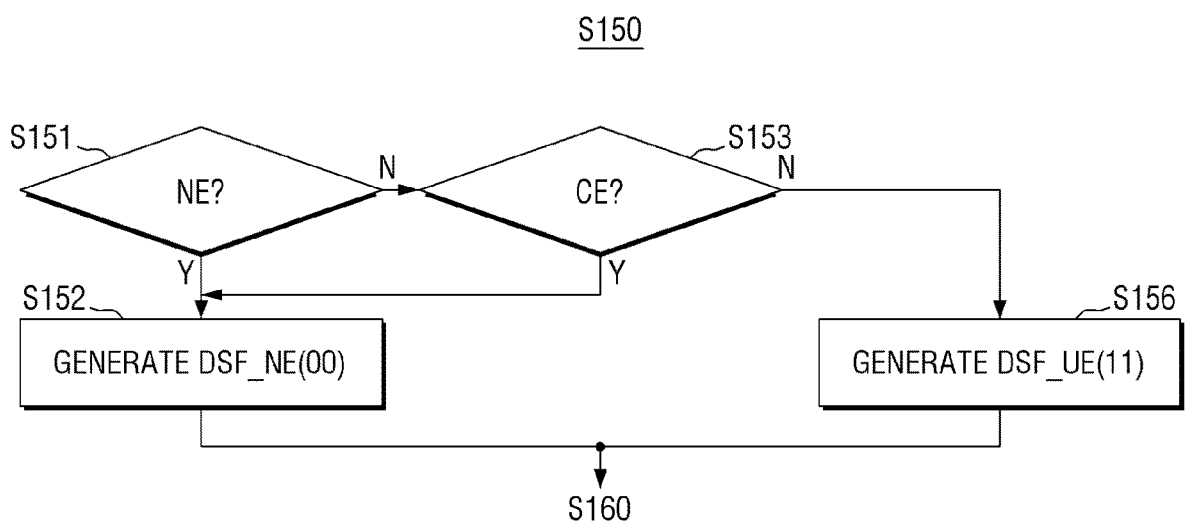
FIG. 11 is a flowchart for explaining operations S150 of FIG. 9.
Figure 12:
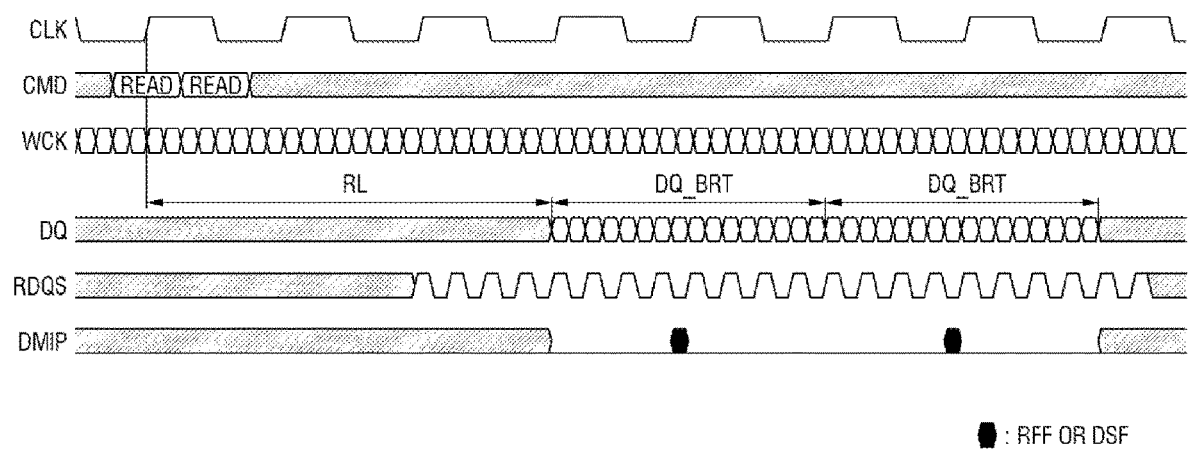
FIG. 12 is a timing diagram for explaining the operation of the memory device according to the example embodiments of FIG. 9.

FIG. 9 is a flowchart for explaining the operation of the memory device according to some example embodiments. FIG. 10 is a flowchart for explaining operation S140 of FIG. 9. FIG. 11 is a flowchart for explaining operation S150 of FIG. 9. FIG. 12 is a timing diagram for explaining the operation of the memory device according to the example embodiments of FIG. 9.

Referring to FIGS. 1 to 9, a memory device 200 according to some example embodiments may receive a read command READ_CMD and a read address READ_ADDR from the memory controller 100 (S100). The read row address R_ADDR included in the read address READ_ADDR and the fail row address FAIL_ADDR detected from the row fail detector 500 may be provided to the address comparator 620 of the flag generator 600.

The address comparator 620 may compare whether the read row address R_ADDR and the fail row address FAIL_ADDR are the same (S110). The address comparator 620 may output the comparison signal CS_A indicating the comparison result.

The signal generator 630 of the flag generator 600 may generate a fail row flag RFF when the read row address R_ADDR and the fail row address FAIL_ADDR are the same (S110, Y) based on the comparison signal CS_A (S120). The fail row flag RFF may be made up of two bits, and may have a value of '10'.

The data in which an error is corrected by the ECC engine 400, and the fail row flag RFF generated by the flag generator 600 may be output (S130).

On the other hand, at operation S110, when the read row address R_ADDR and the fail row address FAIL_ADDR are not the same (S110, N) based on the comparison signal CS_A, the signal generator 630 of the flag generator 600 may determine whether the number of errors detected in the scrubbing operation of the memory device 200 is equal to or greater than a threshold TH_CE based on a comparison signal CTL_CE provided from the control logic 210 (S115). The threshold TH_CE may be, for example, a value that is set from the memory controller 100, and may be set depending on the specifications of the memory device 200.

When the comparison signal CTL_CE indicates that the number of errors detected is equal to or greater than the threshold TH_CE (S115, Y), the signal generator 630 may generate the decoding state flag DSF, without considering the threshold TH_CE (S140).

Referring to operation S140 in FIG. 10, when the ECC engine 400 has capability of SEDSEC (single bit error detection single bit error correction), the signal generator 630 may determine whether an error is detected from the read data and whether the error is corrected, based on a syndrome SDR provided from the ECC engine 400 and the number of counted first error occurrence signals EGS_R.

The signal generator 630 may determine whether the decoding result of the ECC engine 400 is a case where no error is detected from the read data (No Error; NE) (S141). For example, when the syndrome SDR is 0 and the number of counted first error occurrence signals EGS_R is 0, the signal generator 630 may determine that there is a case where no error is detected from the read data. At operation S141, when the decoding result of the ECC engine 400 is a case where no error is detected from the read data (S141, NE=Y), the signal generator 630 may generate a decoding state flag DSF indicating this (S142). The decoding state flag DSF may be made up of two bits and may have a value of '00'.

At operation S141, when the decoding result of the ECC engine 400 is not a case where no error is detected from the read data (S141, NE=N), the signal generator 630 may determine whether there is a case where one error is detected and corrected from the read data (Correctable Error; CE) (S143). For example, when the syndrome SDR is not 0 and the number of counted first error occurrence signals EGS_R is 1, the signal generator 630 may determine that there is a case one error is detected from the read data and corrected. At operation S143, when the decoding result of the ECC engine 400 is a case where one error is detected from the read data and corrected (S143, CE=Y), the signal generator 630 may generate the decoding state flag DSF indicating this (S144). The decoding state flag DSF may be made up of two bits, and may have a value of '01' (DSF_CE(01)). At operation S143, when the decoding result of the ECC engine 400 is not a case where one error is detected from the read data and corrected (S143, CE=N), the signal generator 630 may generate a decoding state flag DSF indicating a case UE where two or more errors are found from the read data and are not corrected. The decoding state flag DSF may be made up of two bits, and may have a value of '11' (DSF_UE(11)).

Referring to FIGS. 1 to 9 again, when the comparison signal CTL_CE at operation S115 of FIG. 9 indicates that the number of errors detected in the scrubbing operation of the memory device 200 is less than the threshold TH_CE (S115, N), the signal generator 630 may generate a decoding state flag DSF in consideration of the threshold TH_CE (S150).

Referring to operation S150 in FIG. 11, when the ECC engine 400 has capability of SEDSEC, the signal generator 630 may determine whether an error is detected from the read data and whether the error is corrected, based on the syndrome SDR provided from the ECC engine 400 and the first error occurrence signal EGS_R.

The signal generator 630 may determine whether the decoding result of the ECC engine 400 is a case NE where no error is detected from the read data (S151). For example, when the syndrome SDR is 0 and the number of counted first error occurrence signals EGS_R is 0, the signal generator 630 may determine that there is a case where no error is detected from the read data. At operation S151, when the decoding result of the ECC engine 400 is a case where no error is detected from the read data (S151, NE=Y), the signal generator 630 may generate a decoding state flag DSF indicating this (S152). The decoding state flag DSF may be made up of two bits, and may have a value of '00' (DSF_NE (00)).

At operation S151, when the decoding result of the ECC engine 400 is not a case where no error is detected from the read data (S151, NE=N), the signal generator 630 may determine whether there is a case where one error is detected from the read data and corrected (S153). For example, when the syndrome SDR is not 0 and the number of counted first error occurrence signals EGS_R is 1, the signal generator 630 may detect that there is a case where one error is detected from the read data and corrected. When the decoding result of the ECC engine 400 at operation S153 is a case where one error is detected from the read data and corrected (S153, CE=Y), the signal generator 630 may perform operation S152. Thus, the signal generator 630 may generate a decoding state flag DSF that is made up of two bits and has a value of '00'. The signal generator 630 may not generate a decoding state flag DSF having a value of '01'.

When the decoding result of the ECC engine 400 at operation S153 is not a case where one error is detected from the read data and corrected (S153, CE=N), the signal generator 630 may generate a decoding state flag DSF indicating a case UE where two or more errors are found from the read data and not corrected. The decoding state flag DSF may be made up of two bits and may have a value of '11' (DSF_UE(11)).

Referring to FIGS. 1 to 9 again, the data in which an error is corrected by the ECC engine 400 and the decoding state flag DSF generated by the flag generator 600 may be output (S160 of FIG. 9). For example, the decoding state flag DSF may be made up of two bits, and may have any one value among '00', '01', '10' and '11'.

Referring to FIG. 12, the clock signal CLK may be provided from the memory controller 100 to the memory device 200. A write clock signal WCK may be provided from the memory controller 100 together with the command CMD. A read strobe signal RDQS is a signal that is transmitted to the memory controller 100 together with the data DQ by the memory device 200. A read latency RL may indicate a delay from the reception of the read command READ to the output of the data DQ.

The read data DQ may be provided to the memory controller 100 in burst units DQ_BRT through the first pin (202 of FIG. 8).

The decoding state flag DSF or the fail row flag RFF may be provided to the memory controller 100 through the second pin 204. The second pin (204 of FIG. 8) may be a DMI pin (DMIP). The decoding state flag DSF or the fail row flag RFF may be output together with the read data DQ.

When generating the decoding state flag DSF in consideration of the threshold of correctable error as in operation S150, when it is less than the threshold of correctable error, the memory device 200 may only output a decoding state flag DSF indicating a case NE where no error is detected from the read data or a decoding state flag DSF indicating a case UE where two or more errors are found and not corrected. Therefore, the memory controller 100 may not determine whether there is a case CE where one error is detected in the read row address R_ADDR and corrected. Thus, even when the read row address R_ADDR is a fail row, the memory controller 100 may not determine this.

On the other hand, when the read row address R_ADDR is a fail row address as in operation S110, the memory device 200 according to some example embodiments may output a fail row flag RFF irrespective of the threshold of correctable error. As a result, the memory controller 100 may determine that it is a fail row, and may determine an error management policy based on this. Therefore, the reliability of the memory device 200 may be further improved or enhanced.

Figure 13:
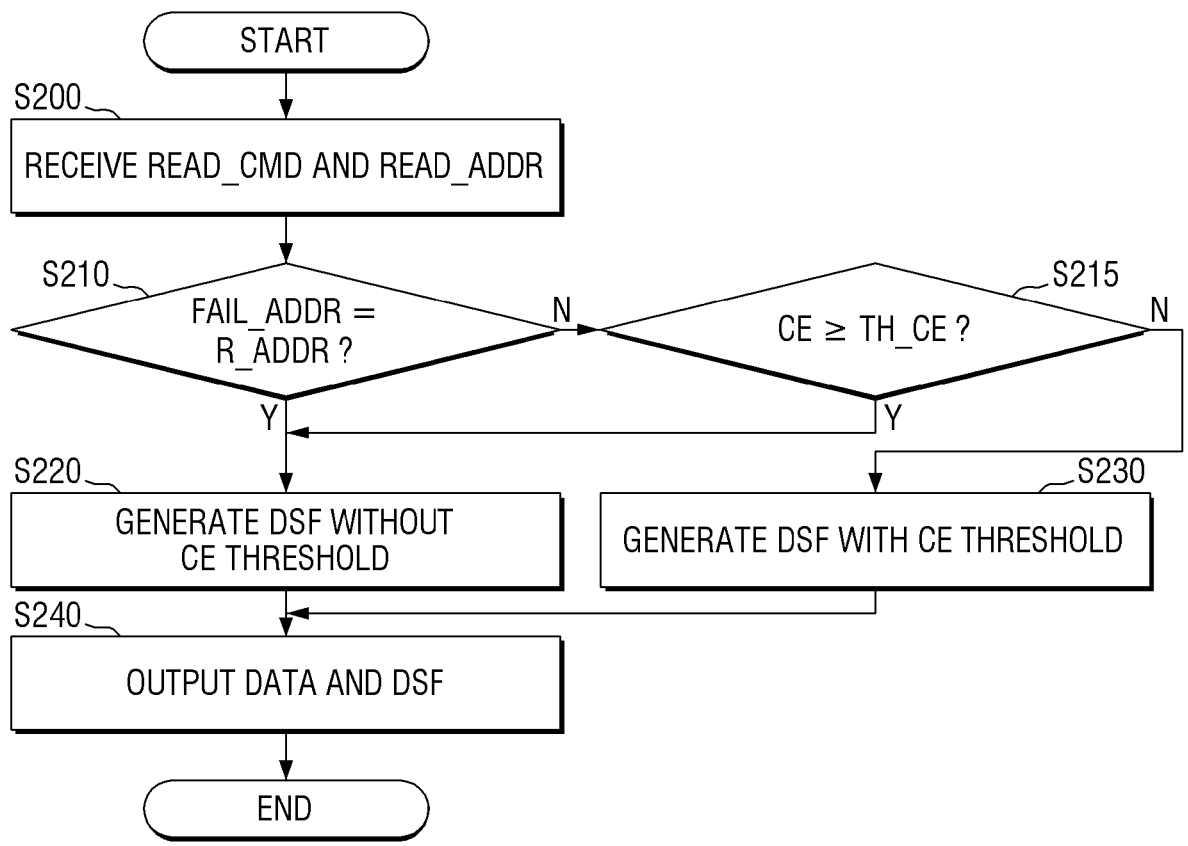
FIG. 13 is a block diagram for explaining the operation of the memory device according to some other example embodiments.
Figure 14:
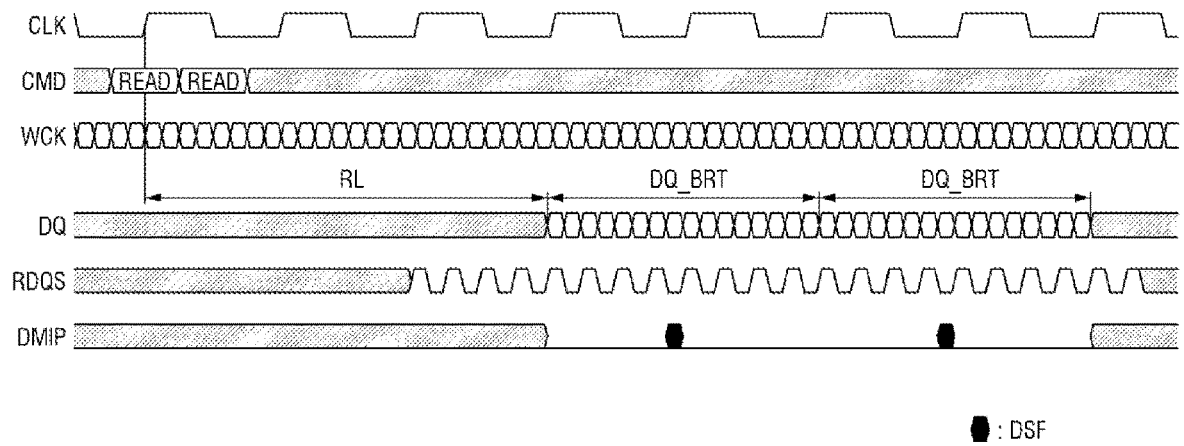
FIG. 14 is a timing diagram for explaining the operation of the memory device according to the example embodiments of FIG. 13.

FIG. 13 is a block diagram for explaining the operation of the memory device according to some other example embodiments. FIG. 14 is a timing diagram for explaining the operation of the memory device according to the embodiment of FIG. 13.

Referring to FIGS. 1 to 13, a memory device 200 according to some example embodiments may receive a read command READ_CMD and a read address READ_ADDR (S200), and compare whether the read row address R_ADDR and the fail row address FAIL_ADDR are the same (S210). Operations S200, S210, and S215 may correspond to operations S100, S110, and S115 of FIG. 10, respectively.

At operation S210, when the read row address R_ADDR and the fail row address FAIL_ADDR are the same based on the comparison signal CS_A (S210, Y), the signal generator 630 of the flag generator 600 may generate the decoding state flag DSF without considering the threshold TH_CE (S220). When the row address R_ADDR and the fail row address FAIL_ADDR are not the same based on the comparison signal CS_A at operation S210 (S210, N), and the comparison signal CTL_CE indicates that the number of detected errors is equal to or greater than the threshold TH_CE at operation S215 (S215, Y), the signal generator 630 of the flag generator 600 may perform the operation of S220. Operation S220 may correspond to operation S140 of FIGS. 9 and 10.

When the comparison signal CTL_CE at operation S215 indicates that the number of detected errors is less than the threshold TH_CE (S215, N), the signal generator 630 may generate the decoding state flag DSF in consideration of the threshold TH_CE (S230). Operation S230 may correspond to operation S150 of FIGS. 9 and 10.

The data in which an error is corrected by the ECC engine 400 and the decoding state flag DSF generated by the flag generator 600 may be output (S240). For example, the decoding state flag DSF may be made up of two bits, and may have any one value among '00', '01', and '11'.

Referring to FIG. 14, the read data DQ may be provided to the memory controller 100 in burst units DQ_BRT through the first pin (202 of FIG. 8).

The decoding state flag DSF may be provided to the memory controller 100 through the second pin 204. The second pin (204 of FIG. 8) may be a DMI pin (DMIP). The decoding state flag DSF may be output together with the read data DQ. When the read row address R_ADDR is a fail row address, the memory device 200 according to some example embodiments may output the decoding state flag DSF indicating a case CE where one error is detected from the read data and corrected, regardless of the threshold of correctable error. As a result, the memory controller 100 may monitor the decoding state flag DSF of the read row address R_ADDR, and may determine the error management policy based on this. Therefore, the reliability of the memory device 200 may be further improved or enhanced.

Figure 15:
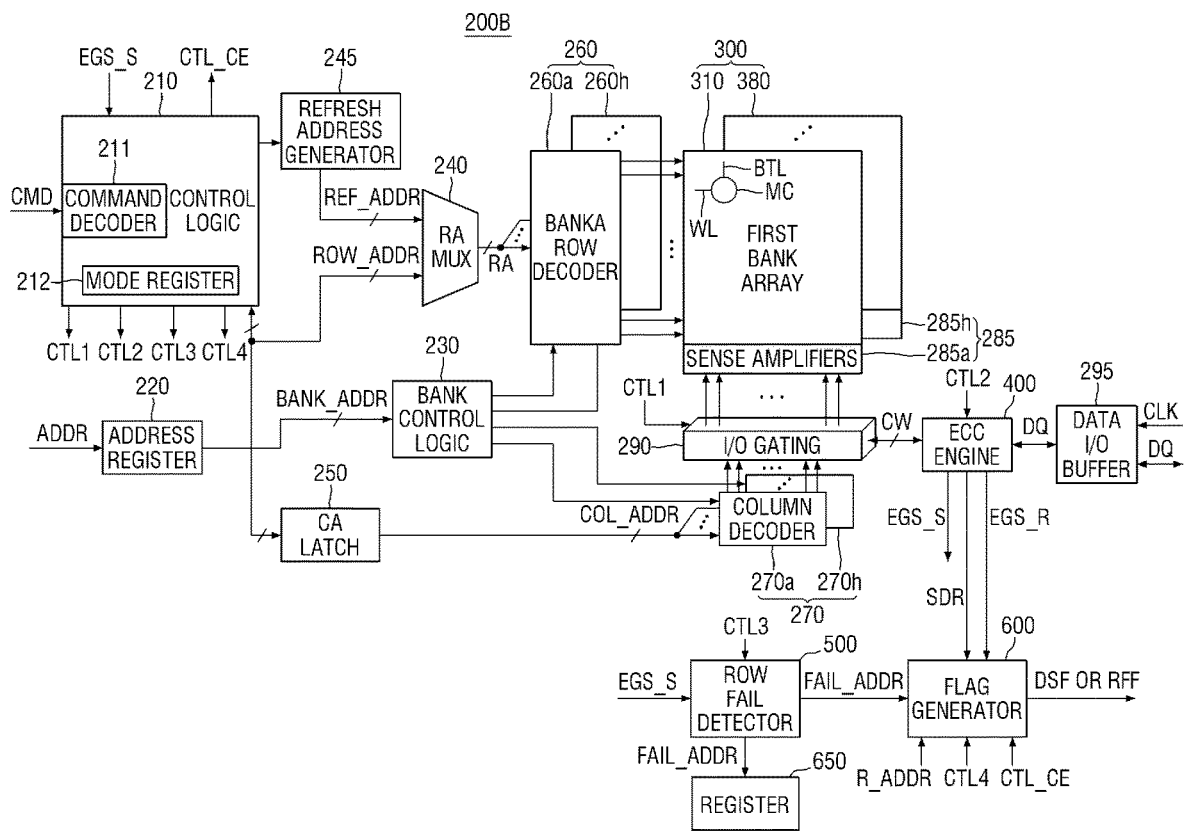
FIG. 15 is a block diagram for explaining the memory device of FIG. 1 according to some other example embodiments.
Figure 16:
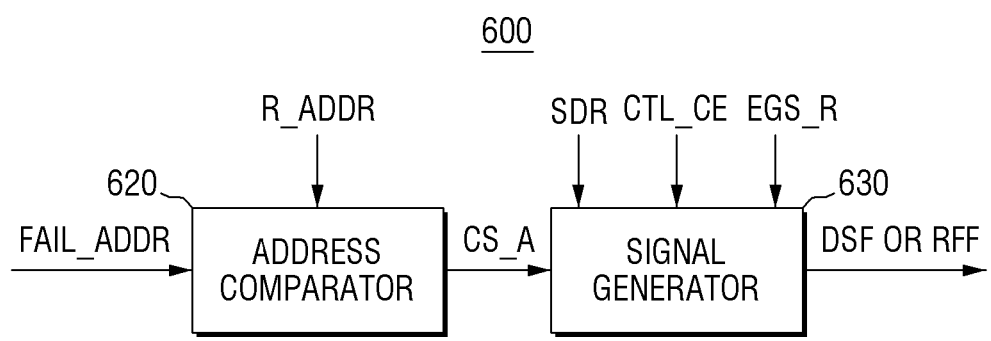
FIG. 16 is a diagram for explaining a flag generator of FIG. 15.

FIG. 15 is a block diagram for explaining the memory device of FIG. 1 according to some other example embodiments. FIG. 16 is a diagram for explaining the flag generator of FIG. 15. For convenience of explanation, points different from those explained referring to FIGS. 1 and 2 will be mainly explained.

Referring to FIGS. 15 and 16, a memory device 200B according to some other example embodiments may include a register 650.

The row fail detector 500 may detect the fail row address of the memory cell array 300 and store the detected fail row address FAIL_ADDR in the register 650. The row fail detector 500 may read the fail row address FAIL_ADDR from the register 650 and provide it to the flag generator 600 in response to the third control signal CTL3.

The flag generator 600 may receive the fail row address FAIL_ADDR to generate a decoding state flag DSF or a fail row flag RFF.

Figure 17:
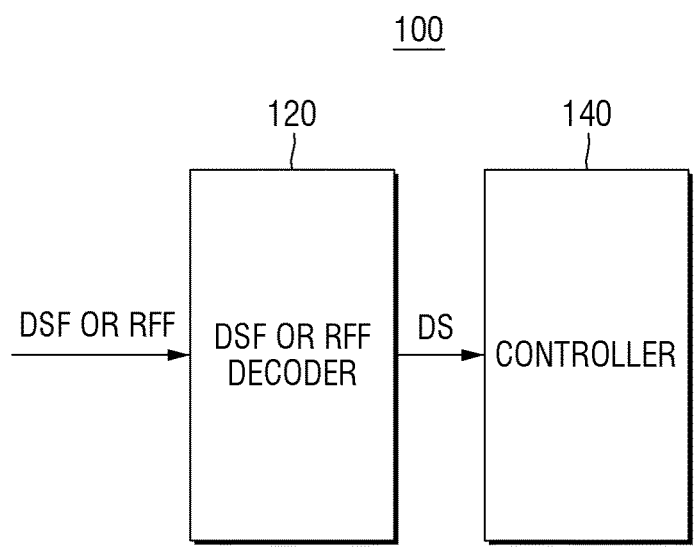
FIG. 17 is a block diagram for explaining the memory controller of FIG. 1.

FIG. 17 is a block diagram for explaining the memory controller of FIG. 1.

Referring to FIGS. 1 and 17, the memory controller 100 may include a decoding state flag or a fail row flag decoder 120 and a controller 140.

The decoding state flag or fail row flag decoder 120 may decode the decoding state flag DSF or the fail row flag RFF provided from the memory device 200 to generate a decoding signal DS.

The controller 140 may monitor the fail row address of the memory cell array 300 or the row address in which an error is detected, based on the decoding signal DS. The controller 140 may determine the error management policy of the memory device 200 based on the decoding signal DS.

For example, when the decoding signal DS indicates a case NE where no error is detected from the read data (for example, when it has a value of '00'), the controller 140 may maintain the error management policy as it is.

When the decoding signal DS indicates that one error is detected from the read data and corrected CE (for example, when it has a value of '01'), the controller 140 may monitor that row. The controller 140 may monitor that row and determine whether it corresponds to a fail row.

When the decoding signal DS indicates a fail row address (e.g., when it has a value of '10'), the controller 140 may perform a page offline of that row. The controller 140 may change the error management policy so as not to use that row.

When the decoding signal DS indicates a case UE where two or more errors are found and are not corrected (when it has a value of '11'), since the data is data including an error, the controller 140 may retry to read the data to the memory device 200. Thus, the read command may be provided to the memory device 200 again. Alternatively, the controller 140 may repair that row with an extra row. Alternatively, the controller 140 may change the error management policy so as not to use that row.

Figure 18:
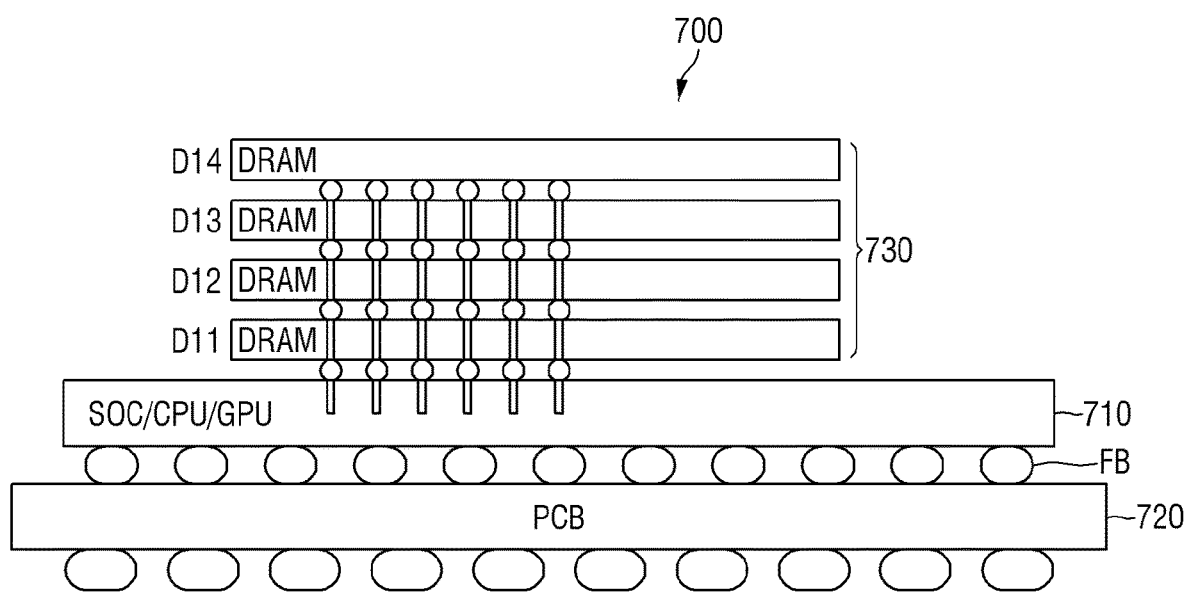
FIG. 18 is a block diagram for explaining a memory device according to some example embodiments.

FIG. 18 is a block diagram for explaining a memory device according to some example embodiments.

Referring to FIG. 18, a memory device 700 according to some example embodiments may be implemented using a 3D chip structure. The memory device 700 may include a host die 710, a PCB 720, and a memory group die 730.

The host die 710 may be placed on the PCB 720. The host die 710 may be connected to the PCB 720 through a flip chip bump FB. The host die 710 may be, for example, a SoC, CPG, or GPU.

The memory group die 730 may include a plurality of stacked memory dies D11 to D14. The plurality of memory dies D11 to D14 may form an HBM structure. TSV lines (through silicon vias) may formed in the memory dies D11 to D14 to implement the HBM structure. The TSV lines may be electrically connected to micro bumps MCB formed between the memory dies D11 to D14.

Although a buffer die or a logic die is omitted in FIG. 18, the buffer die or the logic die may be placed between the memory die D11 and the host die 710.

Figure 19:
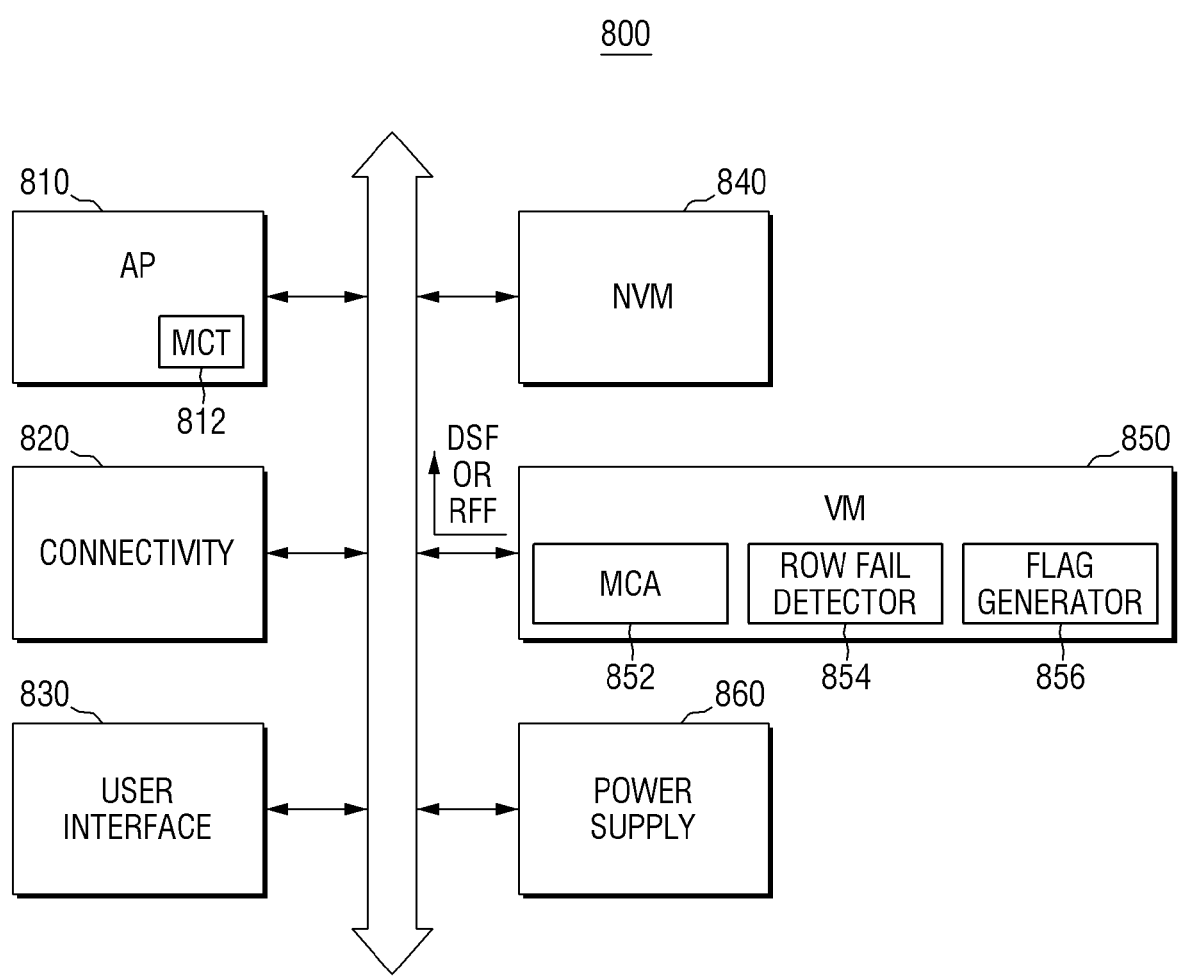
FIG. 19 is a block diagram for explaining a mobile system to which the memory device according to some example embodiments is applied.

FIG. 19 is a block diagram for explaining a mobile system to which the memory device according to some example embodiments is applied.

Referring to FIG. 19, a mobile system 800 may include an application processor 810, a connectivity 820, a user interface 830, a non-volatile memory device 840, a volatile memory device 850, and a power supply 860. The volatile memory device 850 may include a memory cell array 852 and a channel interface circuit.

The application processor 810 may execute applications that provide Internet browsers, games, videos, and the like. The application processor 810 may include a memory controller 812 that controls the volatile memory device 850.

The connectivity 820 may perform a wireless communication or a wired communication with an external device.

The volatile memory device 850 may store data processed by the application processor 810 or may function as a working memory. The volatile memory device 850 may include the memory cell array MCA 852, a row fail detector 854, and a flag generator 856. The volatile memory device 850 may be implemented as the memory device described referring to FIGS. 1 to 16. The memory controller 812 may monitor the fail row addresses accordingly.

The non-volatile memory device 840 may store a boot image for booting the mobile system 800.

The user interface 830 may include one or more input devices such as keypads and touch screens, and/or one or more output devices such as speakers and display devices. The power supply 860 may supply the operating voltage of the mobile system 800.

The mobile system 800 or the components of the mobile system 800 may be implemented using various forms of packages.

By way of summation and review, a reduction in a manufacturing process scale may lead to increased bit error rates and decreased yields.

As described above, embodiments may provide a memory device and a memory system in which reliability is improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated.

Accordingly, it will be understood by those of skill in the art that various changes in form and details may be made without departing from the spirit and scope of the present invention as set forth in the following claims.

What is claimed is:

1. A memory device, comprising:
   a memory cell array including memory cells arranged in a plurality of rows;
   an ECC engine configured to detect an error in first data that is read from the memory cell array in response to a read command and a read address, to output a first error occurrence signal, and to correct the error in the first data;
   a row fail detector configured to output a fail row address, which indicates a fail row among the plurality of rows; and
   a flag generator configured to receive the read address, the first error occurrence signal, and the fail row address, and to generate one of a decoding state flag, which indicates whether an error is detected and whether an error is corrected, and a fail row flag, which indicates that a read row address included in the read address is the fail row address.

2. The memory device as claimed in claim 1, wherein the flag generator includes:
   a comparator configured to compare the read row address with the fail row address, and to output a comparison signal, and
   a signal generator configured to generate one of the decoding state flag and the fail row flag based on the comparison signal.

3. The memory device as claimed in claim 1, wherein:
   the flag generator is configured to generate the fail row flag when the read row address and the fail row address are the same, and
   the flag generator is configured to generate the decoding state flag when the read row address and the fail row address are not the same.

4. The memory device as claimed in claim 3, wherein:
   the ECC engine is configured to generate a first syndrome of the error in the first data, and
   the flag generator is configured to generate the decoding state flag based on a value obtained by counting the first error occurrence signal and the first syndrome, when the read row address and the fail row address are not the same.

5. The memory device as claimed in claim 3, wherein:
   the ECC engine is configured to generate a first syndrome of the error in the first data, and
   the flag generator is configured to generate the fail row flag regardless of the first syndrome and the first error occurrence signal, when the read row address and the fail row address are the same.

6. The memory device as claimed in claim 1, wherein:
   the ECC engine is configured to, for a section in which a refresh operation of the plurality of rows is performed, detect an error in second data that is read from the memory cell array indicated by a scrubbing row address among the plurality of rows,
   output a second error occurrence signal, and
   perform a scrubbing operation to correct the error in the second data, and write error-corrected second data to the memory cell array indicated by the scrubbing row address, and
   the row fail detector is configured to output whether the scrubbing row address is a fail row address based on the second error occurrence signal.

7. The memory device as claimed in claim 6, wherein:
   the ECC engine is configured to generate a second syndrome of the error in the second data, and
   the row fail detector is configured to count the second error occurrence signal, and output the scrubbing row address as the fail row address based on a value obtained by counting the second error occurrence signal and the second syndrome.

8. The memory device as claimed in claim 6, wherein:
   the ECC engine is configured to perform the scrubbing operation for each of the plurality of rows, and to generate a first syndrome of the error in the first data,
   the ECC engine is configured to count the second error occurrence signals output in each of the scrubbing operations,
   the ECC engine further includes a control logic configured to compare a value obtained by counting the second error occurrence signal with a second threshold, and to output a comparison signal,
   the flag generator is configured to generate the decoding state flag based on the first error occurrence signal and the first syndrome, when the read row address and the fail row address are the same, and
   the flag generator is configured to generate the decoding state flag based on the first error occurrence signal, the first syndrome, and the comparison signal, when the read row address and the fail row address are not the same.

9. The memory device as claimed in claim 8, wherein:
   the flag generator is configured to generate the decoding state flag based on the first syndrome and the first error occurrence signal such that:
   the decoding state flag has a first value that indicates that no error is detected, and
   the decoding state flag has a second value that indicates that an error is detected and corrected,
   the decoding state flag has a third value that indicates that two or more errors are detected and not corrected, and
   based on the comparison signal, when the read row address and the fail row address are not the same, the decoding state flag having the second value is not generated.

10. The memory device as claimed in claim 9, wherein the flag generator is configured to generate the decoding state flag having the first value or generate the decoding state flag having the third value, when:
    the read row address and the fail row address are not the same, and
    the comparison signal indicates that the value obtained by counting the second error occurrence signal is less than to the second threshold.

11. The memory device as claimed in claim 1, wherein the row fail detector is configured to detect the fail row address for each section in which a refresh operation of the plurality of rows is performed.

12. A memory device, comprising:
    a memory cell array including memory cells arranged in a plurality of rows;
    an ECC engine configured to detect an error in first data that is read from the memory cell array in response to a read command and a read address, to output an error occurrence signal and a syndrome of the error in the first data, and to correct the error in the first data;
    a row fail detector configured to periodically detect a fail row address, which indicates a fail row among the plurality of rows; and a flag generator configured to compare a read row address included in the read address with the fail row address, generate a fail row flag, which indicates that the read row address is a fail row address, when the read row address and the fail row address are the same, and generate a decoding state flag, which indicates whether an error is detected and whether an error is corrected, based on the syndrome and the error occurrence signal, when the read row address and the fail row address are not the same.

13. The memory device as claimed in claim 12, wherein the row fail detector is configured to detect the fail row address in a section in which a refresh operation of the plurality of rows is performed in response to a refresh command.

14. The memory device as claimed in claim 13, wherein:
the ECC engine is configured to, after the refresh operation of the plurality of rows is performed in response to the refresh command, detect an error in second data that is read from the memory cell array, generate a second error occurrence signal, perform a scrubbing operation that corrects the error in the second data, and write error-corrected second data to the memory cell array, and
the row fail detector is configured to count the second error occurrence signal to detect the fail row address.

15. The memory device as claimed in claim 14, wherein the flag generator is configured to generate the decoding state flag based on a value of the counted second error occurrence signal, and to generate the fail row flag regardless of the value of the counted second error occurrence signal.

16. The memory device as claimed in claim 12, further comprising:
a first pin, which is configured to send and receive data; and
a second pin, which is configured to output the fail row flag or the decoding state flag, and which is different from the first pin.

17. The memory device as claimed in claim 16, wherein:
the second pin includes a first sub-pin and a second sub-pin different from each other, and
the decoding state flag and the fail row flag are made up of two bits, and are output through the first sub-pin and the second sub-pin.

18. A memory system, comprising:
a memory device; and
a memory controller configured to provide a read command and a read address to the memory device, wherein:
the memory device includes:
 a memory cell array including memory cells arranged in a plurality of rows,
 an ECC engine configured to detect an error in first data that is read from the memory cell array in response to the read command and the read address, to output a first error occurrence signal, and to correct the error in the first data,
 a row fail detector configured to output a fail row address, which indicates a fail row among the plurality of rows, and
 a flag generator configured to generate a decoding state flag and a fail row flag based on the read address, the first error occurrence signal, and the fail row address,
the fail row flag is made up of two bits and has a first value, and
the decoding state flag is made up of two bits and has any one of second, third, and fourth values that are each different from the first value and different from each other.

19. The memory system as claimed in claim 18, wherein the memory controller is configured to receive one of the fail row flag and the decoding state flag, and to determine an error management policy of the memory device.

20. The memory system as claimed in claim 19, wherein the memory controller is configured to determine the error management policy so as not to use the read address when receiving the fail row flag having the first value.

* * * * *